United States Patent
King et al.

(10) Patent No.: US 8,251,619 B2
(45) Date of Patent: Aug. 28, 2012

(54) HOLE MACHINING METHOD FOR CIRCUIT BOARD

(75) Inventors: Yueh-Hsun King, Taipei Hsien (TW); Jhy-Hau Chiu, Taipei Hsien (TW)

(73) Assignee: Foxnum Technology Co., Ltd., Tu-Cheng, New Taipei (TW)

( * ) Notice: Subject to any disclaimer, the term of this patent is extended or adjusted under 35 U.S.C. 154(b) by 699 days.

(21) Appl. No.: 12/491,241

(22) Filed: Jun. 25, 2009

(65) Prior Publication Data

US 2010/0284755 A1 Nov. 11, 2010

(30) Foreign Application Priority Data

May 11, 2009 (CN) .......................... 2009 1 0302199

(51) Int. Cl.
- *B23B 35/00* (2006.01)
- *B23B 41/00* (2006.01)
- *H05K 3/00* (2006.01)

(52) U.S. Cl. ........................................ 408/1 R

(58) Field of Classification Search .................. 408/1 R; B23B 35/00, 41/00, 41/14; H05K 3/00, H05K 3/46

See application file for complete search history.

(56) References Cited

U.S. PATENT DOCUMENTS 5,533,841 A * 7/1996 Iwano et al. .................. 408/1 R

FOREIGN PATENT DOCUMENTS

| EP | 642861 A1 | * | 3/1995 |
| JP | 02232108 A | * | 9/1990 |
| JP | 04193410 A | * | 7/1992 |
| JP | 04352487 A | * | 12/1992 |
| JP | 09029697 A | * | 2/1997 |
| JP | 11284310 A | * | 10/1999 |
| JP | 2002120196 A | * | 4/2002 |

* cited by examiner

*Primary Examiner* — Daniel Howell
(74) *Attorney, Agent, or Firm* — Altis Law Group, Inc.

(57) ABSTRACT

A hole machining method includes drilling two holes are drilled at opposite ends of a drilling area as a start point and an end point. The number of holes between the start point and the end point is determined. A dividing point and a number of holes L are determined according to determined equations. Holes are drilled in the dividing point, and between the start point and the dividing point according to the determined equations.

3 Claims, 3 Drawing Sheets

HOLE MACHINING METHOD FOR CIRCUIT BOARD

BACKGROUND

1. Technical Field

The present disclosure relates to machining methods, and particularly, to a hole machining method for drilling holes in circuit boards.

2. Description of Related Art

In machining a circuit board, some holes are usually defined in the circuit board. One method is to drill a number of intersectant small holes to form a hole.

Referring to FIG. 1, a schematic view of a hole machining method to drill a drill area 20 for a machined hole 30 on a circuit board is shown. In order to more easily understand the related-art hole machining method, the intersectant small holes are not shown as being intersectant in FIG. 1. The related-art hole machining method includes the following steps. In steps S1 and S2, drilling two holes 1 and 2 at opposite ends of the drilling area 20 respectively, setting the two holes 1 and 2 as a start point and an end point of the hole 30. In step S3, drilling a hole 3 in the drilling area 20, at a middle point between the start point and the end point of the drilling area 20. In steps S4 and S5, setting the two holes 1 and 3 as a first new start point and a first new end point and setting the two holes 3 and 2 as a second new start point and a second new end point, and then drilling a hole 4 in the drilling area 20 at a middle point between the first new start point and the first new end point, and drilling a hole 5 in the drilling area 20 at a middle point between the second new start point and the second new end point. In steps S6 to S17, drilling other holes according to the above steps, until all holes are drilled in the drilling area 20, therefore, all the holes, such as seventeen holes 1-17 combine to form the hole 30.

In related art, the following is the usual method to determine the number of holes to be drilled to form a needed hole. The number of holes to be drilled is equal to $2^n+1$, where "n" is a minimum natural number which can satisfy that $2^n+1$ is greater than or equal to a needed number of holes for forming the hole 30. For example, if a needed number of holes for forming the hole 30 is ten, then n=4, and the number of actual holes is then seventeen. Because when n=3, then $2^n+1=9<10$, which does not satisfy the requirement, while when n=4, then $2^n+1=17>10$, which satisfies the requirement. However, when n=4, extra seven holes (17−10=7) must be drilled, which reduces machining efficiency.

DETAILED DESCRIPTION

Figure 1:
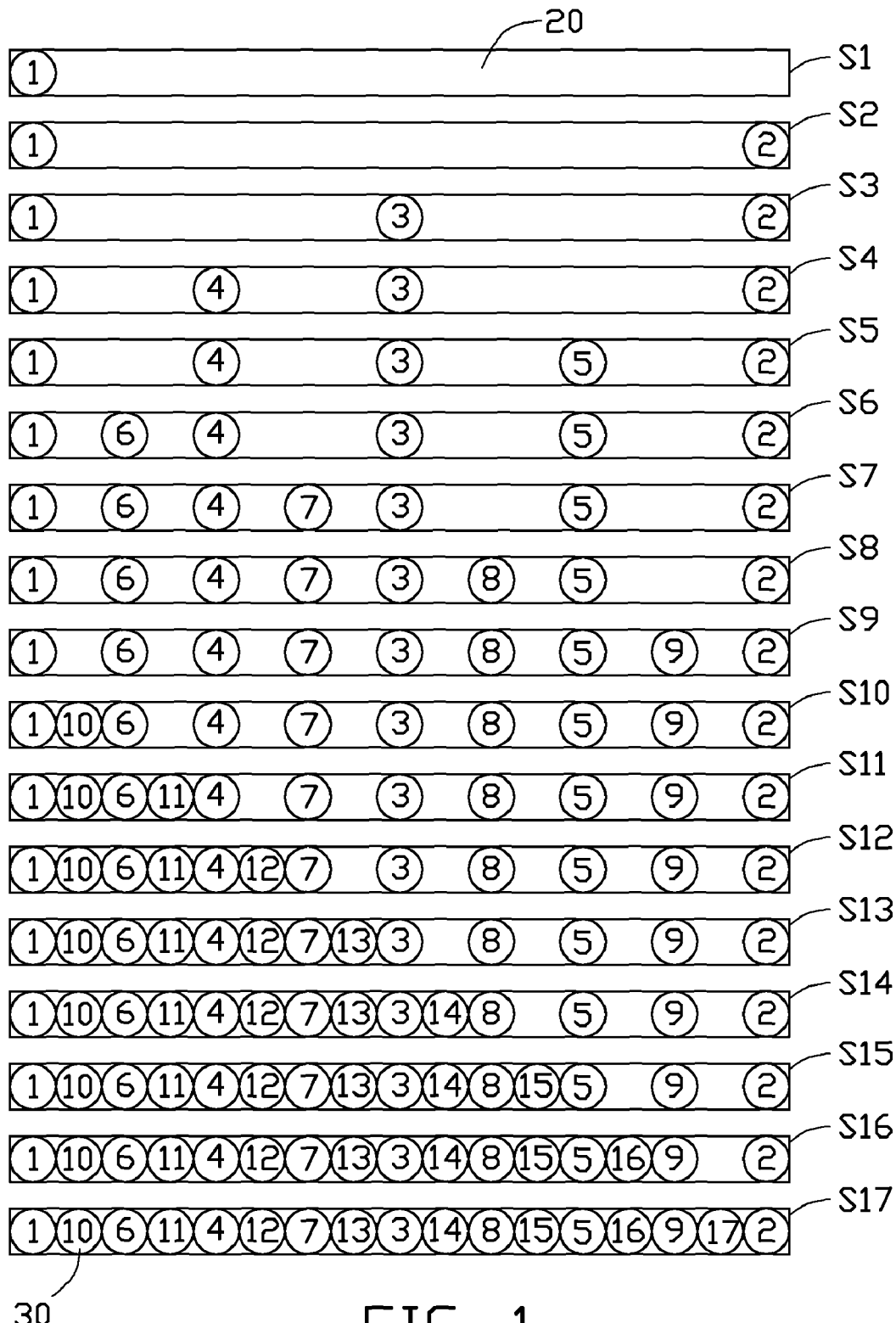
FIG. 1 is a schematic machining diagram of a related-art hole machining method.
Figure 2:
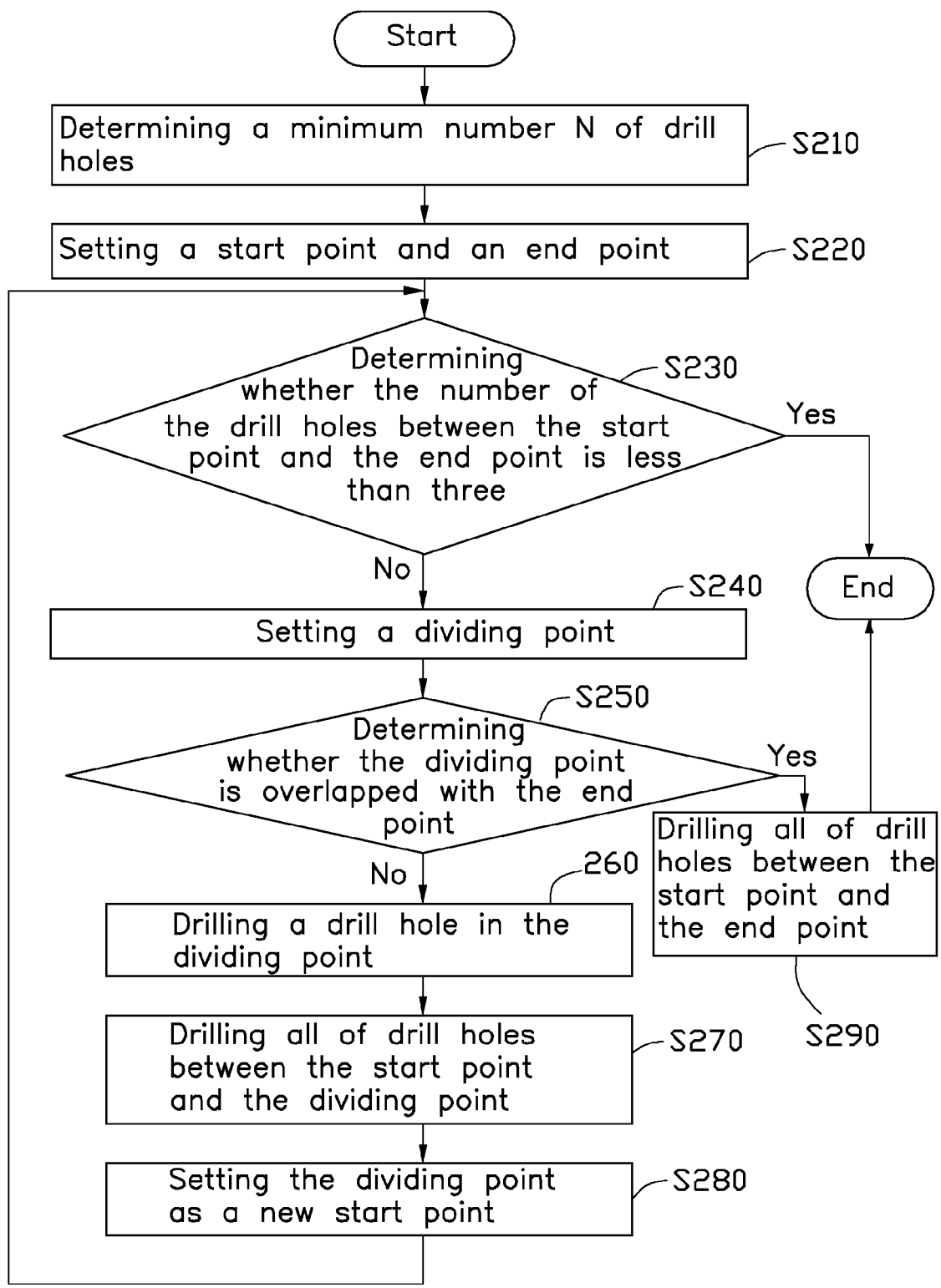
FIG. 2 is a flowchart of an exemplary embodiment of a hole machining method.
Figure 3:
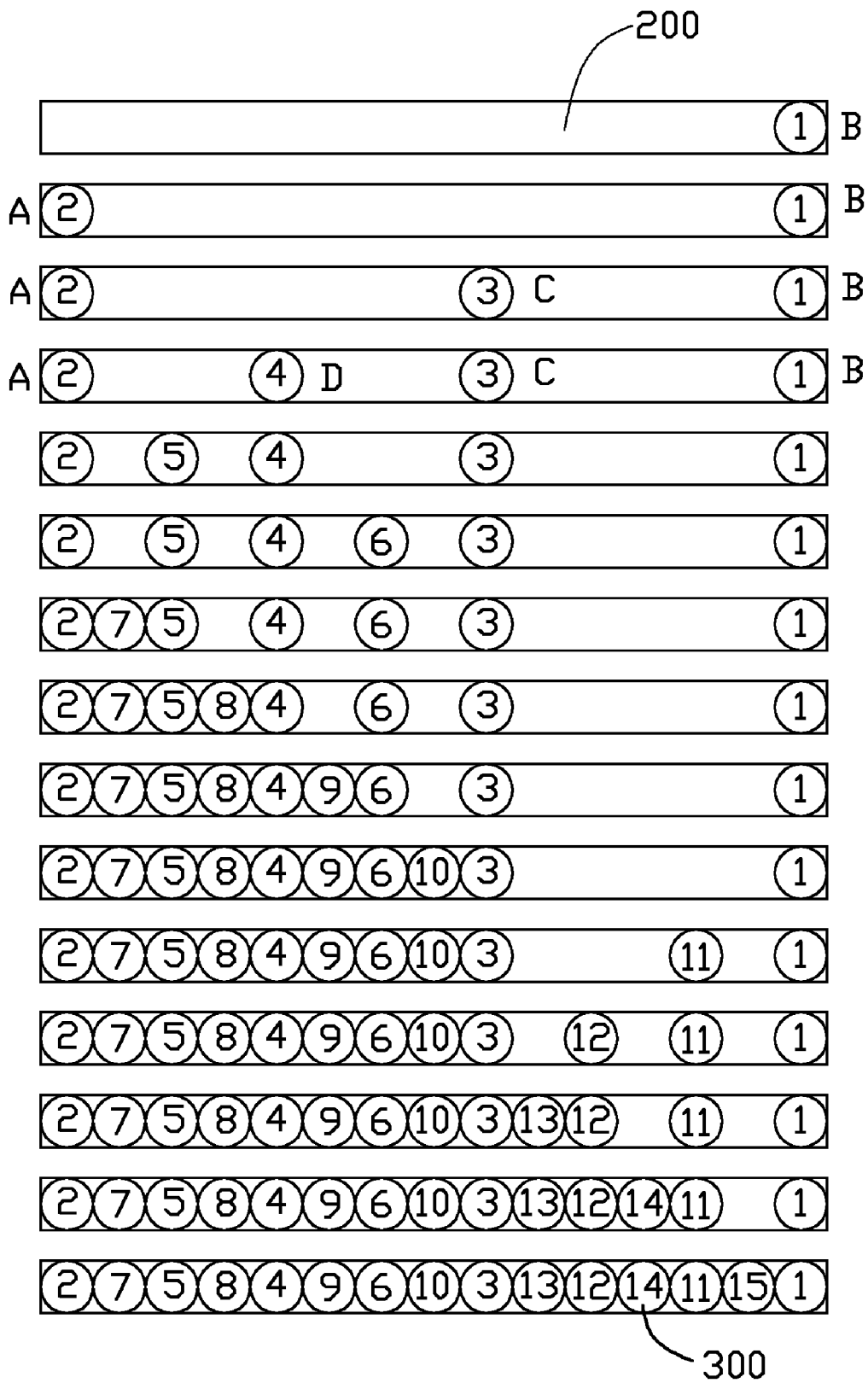
FIG. 3 is a schematic machining diagram of the hole machining method of FIG. 2.

Referring to FIGS. 2 and 3, an exemplary embodiment of a hole machining method is disclosed to drill an area 200 to form a machined hole 300, such as a rectangular hole, in a circuit board. The hole machining method includes the following steps.

In step S210, a minimum number N of holes to be drilled in the area 200 is determined. Shapes and sizes of the number N of holes are the same and equidistant between each two adjacent holes of the number N of holes. Determining the minimum number N of holes to be drilled in the area 200 is known technology, and the determination process is thus not described here. In one embodiment, N may be 15.

In step S220, two holes 1, 2 are drilled at opposite ends of the area 200, respectively, the two holes 2 and 1 are set as a start point A and an end point B.

In step S230, if the number of holes to be drilled between the start point A and the end point B is determined to be less than three, the process ends. The process goes to step S240 in response to the number of holes to be drilled between the start point A and the end point B are not less than three.

In step S240, a dividing point C between the start point A and the end point B is set. A number of holes L to be drilled between the start point A and the dividing point C satisfies: $L=2^n+1$, where "n" is a maximum natural number which can satisfy $2^n+1 \leq N$. For example, if N=15, $L=2^3+1=9$. The number of holes L includes the two holes be drilled at the start point A and the dividing point C.

In step S250, the minimum number N is determined to be equal to the number of holes L that should be drilled between the start point A and the dividing point C, namely the dividing point C is determined to overlap the end point B and $2^n+10=N$. The process goes to step S290 in response to the minimum number N is equal to the number of holes L, and the process goes to step S260 in response to the minimum number N is not equal to the number of holes L.

In step S260, a hole 3 is drilled at the dividing point C.

In step S270, a hole 4 is drilled at a middle point between the start point A (hole 2) and the dividing point C (hole 3). The two holes 2 and 4 are set as a new start point A and a new end point D and the two holes 4 and 3 are set as a new start point D and a new end point C. A hole 5 is drilled at a middle point between the start point A and the end point D and a hole 6 is drilled at a middle point between the start point D and the end point C. Other holes are drilled between the start point A and the dividing point C according to the above steps, until all holes L are drilled between the start point A and the dividing point C.

In step S280, the dividing point C is set as a new start point like the start point A, and the end point B is set as a new end point like the end point B, and then the process returns to step S230.

In step S290, a hole 4 is drilled at a middle point between the start point A (hole 2) and the dividing point C (namely the end point B). The two holes 2 and 4 are set as a new start point A and a new end point D and the two holes 4 and 1 are set as a new start point D and a new end point B. A hole 5 is drilled at a middle point between the start point A and the end point D and a hole 6 is drilled at a middle point between the start point D and the end point B. Other holes are drilled between the start point A and the end point B according to the above steps, until all holes L (namely N) are drilled between the start point A and the end point B, and then the process ends.

Using the hole machining method to drill the drill area 200 to form the hole 300 in the circuit board requires precisely the minimum number of holes needed to achieve the hole 300, which increases machining efficiency.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A hole machining method, comprising:

a: determining a minimum number N of holes to be drilled in an area of an object;

b: drilling a first hole and a second hole in the area, the first hole and the second hole drilled at opposite ends of the area;

c: setting the first hole as a start point and the second hole as an end point;

d: in response to the number of holes between the start point and the end point being not less than three, setting a dividing point between the start point and the end point, wherein a number of holes L to be drilled between the start point and the dividing point satisfies: $L=2^n+1$, where "n" is a maximum natural number which can satisfy $2^n+1 \leq N$;

e: determining whether $2^n+1 \leq N$, and going to step g in response to $2^n+1=N$;

f: drilling a third hole at the dividing point in response to $2^n+1<N$;

g: drilling the number of holes L between the start point and the dividing point, comprising:

g1: drilling a fourth hole at a middle of the area between the start point and the dividing point;

g2: setting the first hole at the start point and the fourth hole at the middle of the area between the start point and the dividing point as a new first start point and a new first end point;

g3: setting the fourth hole at the middle of the area between the start point and the dividing point, and setting the third hole at the dividing point as a new second start point and a new second end point;

g4: drilling a fifth hole at a middle of the area between the new first start points and the new first end point, and drilling a sixth hole at a middle of the area between the new second start points and the new second end point; and g5: repeating the steps g1-g4, until the number of holes L are drilled between the start point and the dividing point; and h: setting the dividing point as a new third start point, and the end point as a new third end point, and returning to the step c.

2. The hole machining method of claim 1, wherein the area of the object is rectangular.

3. The hole machining method of claim 1, wherein shapes and sizes the number N of holes are the same and equidistant between each two adjacent holes of the number N of holes.

* * * * *